United States Patent [19]

Adachi

[11] Patent Number: 5,450,365
[45] Date of Patent: Sep. 12, 1995

[54] MEMORY CARD CONTROL DEVICE

[75] Inventor: Kaoru Adachi, Asaka, Japan

[73] Assignee: Fuji Photo Film Co., Ltd., Kanagawa, Japan

[21] Appl. No.: 243,790

[22] Filed: May 17, 1994

[30] Foreign Application Priority Data

May 20, 1993 [JP] Japan .................................. 5-141493

[51] Int. Cl.⁶ ............................ G11C 7/00; G06K 7/06
[52] U.S. Cl. ................................ 365/226; 365/189.11; 235/441; 235/492; 348/231
[58] Field of Search ............... 365/226, 189.01, 189.11, 365/189.09; 235/441, 492; 348/231

[56] References Cited

U.S. PATENT DOCUMENTS

| | | | |
|---|---|---|---|
| 5,031,149 | 7/1991 | Matsumoto et al. | 365/189.11 |
| 5,058,063 | 10/1991 | Wada et al. | 365/189.11 |
| 5,202,855 | 4/1993 | Morton | 365/226 |
| 5,297,095 | 3/1994 | Sato et al. | 365/189.11 |

*Primary Examiner*—David C. Nelms
*Assistant Examiner*—Tan Nguyen

[57] ABSTRACT

In a memory card control device for interfacing an electronic still camera or similar electronic equipment and a memory card removably mounted on the equipment, a data processing device operates only at a supply voltage of 5 volts while a logic circuit operates at a supply voltage of 3 volts. A first level shifter converts the level of signals output from the memory card to a level matching the logic circuit. A second level shifter converts the level of signals output from the logic circuit to 5 volts and transfers it to the processing device, while converting the level of signals output from the processing device to 3 volts and feeding it to the logic circuit. The control device accommodates various kinds of memory cards each having a particular rated supply voltage.

10 Claims, 1 Drawing Sheet

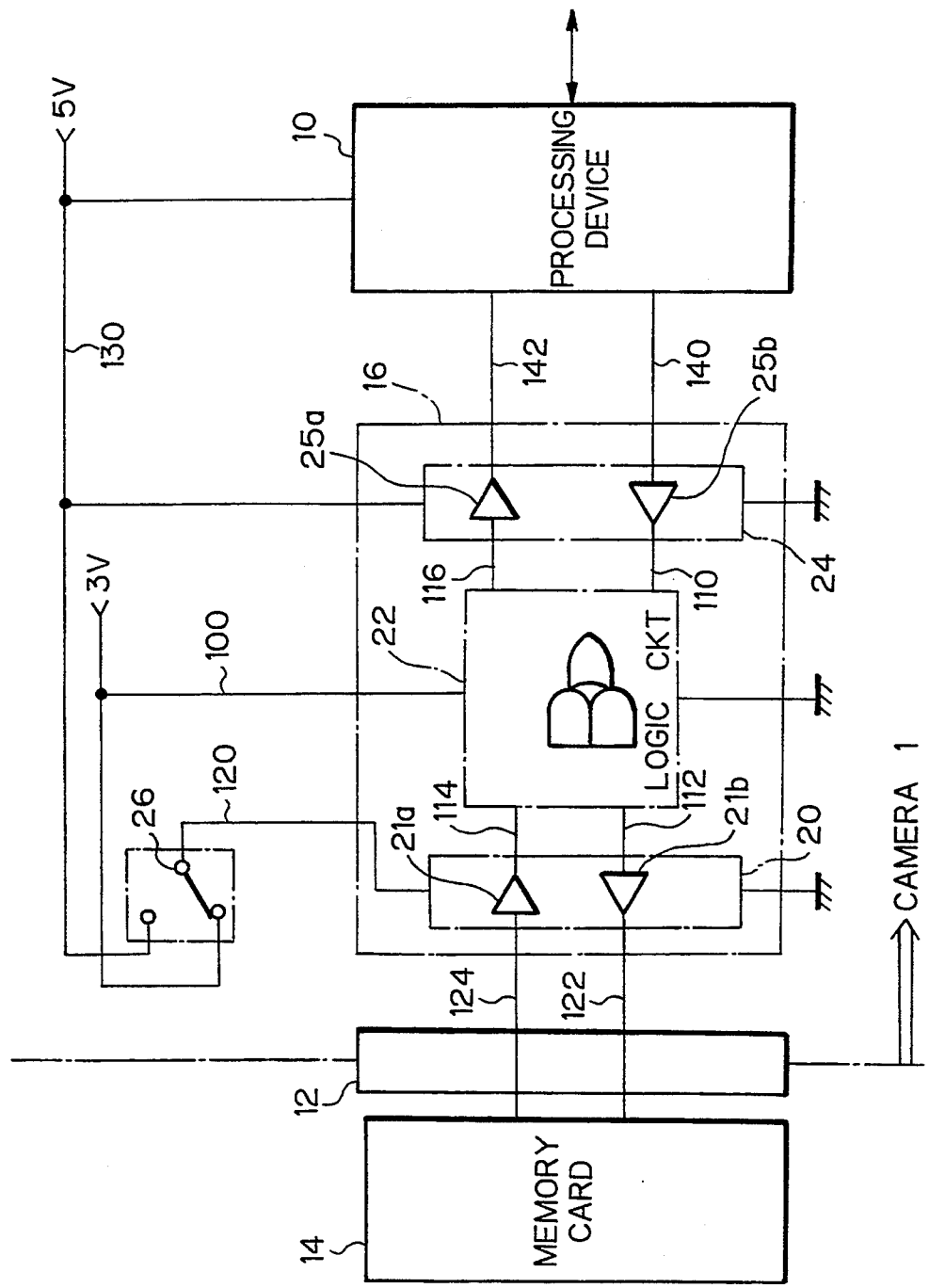

MEMORY CARD CONTROL DEVICE

BACKGROUND OF THE INVENTION

Field of the Invention

The present invention relates to electronic equipment operable with a memory card in or out of which image data or similar data may be written or read and, more particularly, to a memory card control device built in such equipment.

Description of the Related Art

Electronic equipment operable with a memory card include an electronic still camera capable of picking up a desired scene and generating image data representative of the scene. It is a common practice with this kind of camera to install a memory card control device for controlling the writing or reading of image data in or out of a memory card removably mounted on the camera. A memory card writes or reads image data under the control of the memory card control device which may be constructed into an LSI (Large-Scale Integrated circuit). With this configuration, it is possible to connect a memory card to the camera and store image data generated by the camera in the card. It has been customary with a memory card to assign a supply voltage of 5 volts for operation. However, advanced semiconductor technologies have realized memory devices operable at a supply voltage of 3 volts although operating at the same timing as memory devices whose rated supply voltage is 5 volts. A memory card using such an alternative memory device is, of course, driven by a voltage of 3 volts.

The conventional memory control device has the following problem when it comes to control over memory cards each having a particular rated supply voltage. Electronic equipment has customarily been constructed to assign to a memory card control device thereof a predetermined supply voltage matching a memory card for use therewith. A memory card implemented as an LSI, for example, has to be provided with the same supply voltage as signal input/output (I/O) pins. Hence, the control device cannot control both of the 3-volt and 5-volt memory cards unless the supply voltages for the LSI and surrounding circuitry are changed each time in conformity to the supply voltage of the memory card. It follows that to change the supply voltage of the control device, the entire equipment has to be initialized by resetting or similar sequence control. With the conventional control device, therefore, it is difficult to construct electronic equipment operable with various kinds of memory cards each having a particular rated supply voltage.

SUMMARY OF THE INVENTION

It is, therefore, an object of the present invention to provide a memory card control device capable of controlling different kinds of memory cards each having a particular rated supply voltage.

In accordance with the present invention, a memory card control device for interfacing electronic equipment and a memory card removably mounted on the equipment by selectively controlling writing or reading of text data or graphic data in or out of the memory card comprises a control circuit for processing, at one of a first and a second supply voltage, signals to be interchanged between the electronic equipment and the memory card, which is operable at the first or the second supply voltage, to thereby control the writing or the reading of the data in or out of the memory card, and a voltage converting circuit intervening between the memory card and the control circuit for converting the level of signals output from the memory card or the level of signals output from the control circuit and then transferring resulting signals to the control circuit or the memory card. The voltage converting circuit converts, when the memory card is operable at the first supply voltage, the level of signals output from the memory card to a level corresponding to the supply voltage applied to the control circuit and then outputs the resulting signals to the control circuit, while converting the level of signals output from the control circuit to a level corresponding to the first supply voltage. The voltage converting circuit converts, when the memory card is operable at the second supply voltage, the level of signals output from the memory card to a level corresponding to the supply voltage applied to the control circuit and then outputs the resulting signals to the control circuit, while converting the level of signals to be sent from the control circuit to the memory card to a level corresponding to the second supply voltage.

BRIEF DESCRIPTION OF THE DRAWING

The objects and features of the present invention will become more apparent from the consideration of the following detailed description taken in conjunction with the accompanying drawing in which:

The FIGURE is a block diagram schematically showing an essential part of electronic equipment to which a memory card control device embodying the present invention is applied.

DESCRIPTION OF THE PREFERRED EMBODIMENT

Referring to a single FIGURE, electronic equipment to which a memory card control device embodying the present invention is applied is shown. The equipment is implemented as, for example, an electronic still camera for picking up a desired scene and generating image data representative of the scene. As shown, the camera, generally 1, has a device 10 for processing the image data, and a memory card control device 16 intervening between the device 10 and a connector 12. When a memory card 14 is connected to the camera 1 via the connector 12, the memory card control device 16 controls the card 14 so as to write image data processed by the device 10 therein or to read image data thereoutof, as needed. It is to be noted that part of the camera 1 not relevant to the understanding of the present invention is not shown or described for simplicity. In the FIGURE, signals are each designated by a particular reference numeral attached to a signal line on which it appears.

The memory card control device 16 will be described in detail hereinafter. By controlling the memory card 14, the control device 16 causes it to receive data, e.g., image data representative of a scene picked up from the processing device 10 and write them therein. Also, the control device 16 transfers image data or similar data read out of the memory card 14 to the processing device 10. In this sense, the control device 16 plays the role of an interface interfacing the camera 1 and the memory card 14. The control device 16 is constructed such that it can accommodate the memory card 14 whose rated supply voltage is, for example, either 3 volts or 5 volts via the connector 12. On the other hand, the processing device 10 of the camera 1 is operated by a single supply voltage of 5 volts.

The control device 16 is made up of a logic circuit 22 built therein, a first level shifter 20 connected to the logic circuit 22 and memory card 14, and a second level shifter 24 connected to the logic circuit 22 and processing device 10. The logic circuit 22 executes processing for inputting and outputting signals to be interchanged between the memory card 14 and the processing device 10. The level shifter 20 converts the level of an input signal from the memory card 14 to a signal level matching the logic circuit 22, while converting the level of an output signal from the logic circuit 22 to a signal level matching the card 14. The level shifter 24 converts the level of an input signal from the logic circuit 22 to 5 volts and delivers it to the processing device 10. At the same time, the level shifter 24 converts the level of an output signal from the device 10 to 3 volts and delivers it to the logic circuit 22. The control device 16 may advantageously be packaged in a single integrated circuit consisting of the logic circuit 22 and level shifters 20 and 24.

The logic circuit 22 is a controller for controlling the write-in and read-out of image data or similar data from the memory card 14. In the illustrative embodiment, the logic circuit 22 is driven by a single supply voltage of 3 volts applied thereto from a power supply circuit, not shown, via a connection line 100. Stated another way, among the operation voltages of memory cards which may be connected to the camera 1 via the connector 12, the lowest operation voltage is selected to be the supply voltage for the logic circuit 22. For example, when the camera 1 is operable with two different kinds of memory cards whose rated supply voltages are 3 volts and 5 volts, respectively, the logic circuit 22 is constructed to be driven by 3 volts.

Specifically, the logic circuit 22 generates a control signal matching the kind of the memory card 14 connected to the connector 12, thereby controlling the write-in and read-out of data. Assume that the memory card 14 connected to the connector 12 is loaded with an SRAM (Static Random Access Memory). Then, the logic circuit 22 sets an address for writing or reading data in or out of the memory card 14, and then sends a write enable signal, read enable signal or similar control signal to the card 14. On the other hand, assume that the memory card 14 is implemented by an EEPROM (Electrically Erasable Programmable Read Only Memory). Then, the logic circuit 22 generates, in the event of writing or reading data in or out of the card 14, a control signal representative of a command for controlling the card 14, thereby executing predetermined sequence control. When processed data, i.e., image data are transferred from the processing device 10 to the logic circuit 22 via the level shifter 24 and an input 110 thereof, the logic circuit 22 produces the data on an output 112 thereof together with a write control signal. To read image data out of the memory card 14, the logic circuit 22 sends a read control signal to the card 14 via an output 112 thereof and connector 12. On receiving image data read out of the memory card 14 on an input 114 thereof, the logic circuit 22 transfers them to the processing device 10 via an output 116 thereof The level shifters 20 and 24 each plays the role of a voltage conversion circuit for converting the voltage of an input signal and outputting the resulting signal. Specifically, the level shifter 20 has a plurality of inputs and a plurality of outputs for inputting and outputting image data and a control signal or similar signal representative of information, and voltage conversion elements 21a and 21b for converting signal levels appeared on the associated inputs.

The level shifter 20 converts the level of an input signal in matching relation to a supply voltage applied to an input 120 thereof. For example, when a supply voltage of 5 volts appears on the input 120, the level shifter 20 causes the voltage conversion element 21b thereof to convert the level of a signal appearing on the input 112 to a 5-volt signal matching the supply voltage. The resulting 5-volt signal appears on the output 122 connected to the connector 12. In this condition, when a 5-volt signal comes in through the connector 12 and input 124, the voltage conversion element 21a transforms it to a 3-volt signal matching a supply voltage of 3 volts and produces the transformed signal on the output 114. On the other hand, assuming that the supply voltage appearing on the input 120 is 3 volts, the level shifter 20 simply produces an input signal on the output 122 or 114 without any level conversion. Specifically, as shown in the FIGURE, a connection line 130 is connected to a switch 26 together with the previously mentioned connection line 100. A supply voltage of 5 volts is applied to the connection line 130 from the power supply circuit, not shown. The switch 26 is, in turn, connected to the level shifter 20 by the connection line 120. In this configuration, the switch 26 selectively feeds 3 volts from the connection line 100 or 5 volts from the connection line 130 to the level shifter 20 over the line 120. In addition, when the memory card 14 is connected to the connector 12, the switch 26 is capable of detecting information representative of the rated supply voltage of the card 14. In response to such information, the switch 26 selects the 3-volt connection line 100 or the 5-volt connection line 130.

The level shifter 24, like the level shifter 20, has a plurality of inputs and a plurality of outputs for inputting and outputting image data and a control signal or similar signal representative of information, and voltage conversion elements 25a and 25b. Driven only by the 5-volt supply voltage appearing on the input 130, the level shifter 24 serves to match the signal level in the processing device 10 and the signal level in the logic circuit 22. For example, when a 5-volt signal from the processing device 10 arrives at the input 140 of the level shifter 24, the level conversion element 25b converts it to a 3-volt signal and produces the 3-volt signal on the output 110. As a 3-volt signal from the logic circuit 22 arrives at the input 116, the voltage conversion element 25a converts it to a 5-volt signal and produces the 5-volt signal on the output 142.

As stated above, in the illustrative embodiment, the level shifter 20 constitutes an input/output (I/O) section connecting the control device 16 to the memory card 14. The connection lines, or supply lines, for applying the respective supply voltages to the level shifter 20 are not connected to 3-volt and 5-volt connection lines laid in the control device 16. Specifically, the switch 26 is located outside of the control device 16 and intervenes between the connection lines 100 and 130 and the connection line 120. Hence, the voltages from the power supply circuit, not shown, are selectively applied to the level shifter 20 via the switch 26.

The memory card control device 16 having the above construction will be operated as follows. To begin with, assume that a memory card 14 whose rated supply voltage is 5 volts is mounted on the camera 1 via the connector 12. On detecting a supply voltage matching the memory card 14, the switch 26 is brought into a condition opposite to the condition shown in the FIGURE; that is, the 5-volt connection line 130 is connected to the connection line 120 via the switch 26. As a result, the supply voltage of 5 volts is applied to the input 120 of the level shifter 20 via the switch 26. In this condition, 5-volt output signals, including image data, from the output 140 of the processing device 10 are transformed to 3-volt signals by the voltage conversion element 25b of the level shifter 24. The 3-volt signals appear on the output 110 of the level shifter 24. These signals are applied to the input 110 of the logic circuit 22, processed by the logic circuit 22, and then produced on the output 112 together with a control signal. The processed signals and control signal are transferred to the input 112 of the other level shifter 20. In response, the voltage conversion element 21b of the level shifter 20 converts them to 5-volt signals and then sends the 5-volt signals to the memory card 14 via the output 122. Consequently, the image data generated by the camera 1 are written to the memory card 14.

When image data stored in the memory card 14 should be read out, the processing device 10 delivers a signal representative of a read command to the control device 16 via the output 140 thereof. Then, the voltage conversion element 25b of the level shifter 24 transforms the signal to a 3-volt signal and feeds the 3-volt signal to the input 110 of the logic circuit 22. In response, the logic circuit 22 generates a 3-volt read control signal. The voltage conversion element 21b transforms the 3-volt read control signal to a 5-volt read control signal and then sends it to the memory card 14 via the connector 12. 5-volt signals, including image data read out of the memory card 14 in response to the control signal, are sent to the input 124 of the level shifter 20. Then, the voltage conversion element 21a of the level shifter 20 converts the 5-volt signals to 3-volt signals and delivers the 3-volt signals to the input 116 of the level shifter 24 via the logic circuit 22. The voltage conversion element 25a included in the level shifter 24 converts the input 3-volt signals to 5-volt signals and transfers the 5-volt signals to the processing device 10 via the output 142.

Assume that the rated supply voltage of the memory card 14 is 3 volts. Then, on detecting a supply voltage matching the memory card 14, the switch 26 is brought into the condition shown in the FIGURE. As a result, the 3-volt connection line 100 is selected by the switch 26 and connected to the input 120 of the level shifter 20, thereby feeding 3 volts to the level shifter 20. In this condition, the control device 16 may operate in exactly the same way as when the rated supply voltage of the memory card 14 is 5 volts, except for the switch 26 and level shifter 20. In this case, the signal applied to the input 112 or 124 of the level shifter 20 directly appears on the associated output 122 or 114 without undergoing voltage conversion. Specifically, 3-volt signals from the memory card 14 are directly input to the logic circuit 22 via the voltage conversion element 21a. The 3-volt signals on the output 116 of the logic circuit 22 are converted to 5-volt signals by the voltage conversion element 25a of the level shifter 24 and then output to the processing device 10. On the other hand, 5-volt signals from the processing device 10 are converted to 3-volt signals by the voltage conversion element 25b and then input to the logic circuit 22. The 3-volt signals on the output 112 of the logic circuit 22 are directly sent to the memory card 14 via the voltage conversion element 21b and output 122.

As described above, the logic circuit 22 built in the control device 16 is driven by a supply voltage of 3 volts. When the memory card 14 mounted on the camera 1 has a rated supply voltage of 5 volts, the voltage conversion element 21a of the level shifter 20 converts the signal level of 5 volts to a signal level of 3 volts. Also, the voltage conversion element 21b converts the signal level of 3 volts output from the logic circuit 22 and meant for the memory card 14 to a signal level of 5 volts. On the other hand, the level shifter 24 performs the conversion of 3 volts to 5 volts and the conversion of 5 volts to 3 volts at all times without regard to the kind of the memory card 14. Hence, the control device 16 operates correctly even when a memory card 14 whose rated voltage is 3 volts is mounted on the camera 1 via the connector 12. The control device 16, therefore, finds a broad range of applications, i.e., accommodates both the memory cards 14 having rated supply voltages of 3 volts and 5 volts. Since the logic circuit 22 built in the control device 16 is driven by 3 volts at all times, resetting or similar sequence is not necessary when the memory card 14 is replaced with another having a different rated supply voltage. In addition, only if the supply voltage to be applied to the input 120 of the control device 14 is switched over, a supply voltage matching the memory card 14 is set up. It follows that when the control device 14 is built in the camera 1 or similar electronic equipment, the system on the equipment side is free from heavy loads.

In the illustrative embodiment, the switch 26 for switching over the voltage to the level shifter 20 may be operated manually. Alternatively, the switch 26 may be operated automatically on the basis of the terminal structure of the memory card 14 or supply voltage information sent from the card 14.

In summary, in accordance with the present invention, a memory card control device includes voltage converting means which selectively receives a voltage matching a memory card operable at a first supply voltage or a memory card operable at a second supply voltage. The control device, therefore, can accommodate various kinds of memory cards each having a particular rated supply voltage. This advantage is achievable only if the supply voltage to the voltage converting means is changed. Stated another way, it is not necessary to change the supply voltage to the entire control device or to change the supply voltage to the surrounding circuitry every time the memory card is replaced. In addition, the control device reduces loads on electronic equipment in which it may be accommodated.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A memory card control device for controlling writing/reading of text or graphic data to/from either a first or a second memory card removably connected to electronic equipment to interface the electronic equipment with the memory card, the first and second memory cards being operable at different first and second supply voltages, respectively, the electronic equipment being operable at the first supply voltage, said device comprising:

control means, supplied with the second supply voltage, for processing signals to be interchanged between the electronic equipment and the one memory card connected to the electronic equipment to thereby control the writing/reading of data to/from said one memory card; and first voltage converting means, electrically connected between said one memory card and the control means and selectively supplied with either the first supply voltage or the second supply voltage, for converting a voltage level of signals output from said one memory card or from said control means, and for then transferring the resulting signals to said control means or said one memory card, respectively;

said first voltage converting means converting, when supplied with the first supply voltage, the voltage level of signals output from said one memory card to a voltage level corresponding to the second supply voltage and outputting the resulting signals to said control means, and also converting a voltage level of signals output from said control means to a voltage level corresponding to the first supply voltage and outputting the resulting signals to said one memory card; and said first voltage converting means transferring, when supplied with the second supply voltage, the voltage level of signals output from said one memory card to said control means as the resulting signals, and also transferring the voltage level of signals output from said control means to said one memory card.

2. A device in accordance with claim 1, wherein said control means comprises a logic circuit built in said device.

3. A device in accordance with claim 1, wherein said first voltage converting means comprises a first level shifter.

4. A device in accordance with claim 3, wherein said first level shifter comprises a first and a second voltage conversion element, said first voltage conversion element being connected at an input to the memory card and at an output to said control means, said second voltage conversion element being connected at an input to said control means and at an output to said memory card.

5. A device in accordance with claim 1, further comprising switch means for selectively applying either the first supply voltage or the second supply voltage to said first voltage converting means.

6. A device in accordance with claim 5, wherein said switch means comprises a manually operable switch.

7. A device in accordance with claim 5, wherein said switch means is operable in response to a terminal structure of the memory card.

8. A device in accordance with claim 5, wherein said switch means is operable in response to supply voltage information sent from the memory card.

9. A device in accordance with claim 1, further comprising second voltage converting means for converting a voltage level of signals output from said control means to the voltage level corresponding to the first supply voltage and for then outputting the resulting signals to the electronic equipment, and also for converting a voltage level of signals output from the electronic equipment to the voltage level corresponding to the second supply voltage and for then outputting the resulting signals to said control means.

10. A device in accordance with claim 1, wherein the electronic equipment is an electronic still camera for detecting a scene image and for storing image data representative of the scene image into the memory card.

* * * * *